United States Patent [19]
Kwak

[11] Patent Number: 5,475,347
[45] Date of Patent: Dec. 12, 1995

[54] COMPACT AC NOISE FILTER WITH GROUND INDUCTOR

[75] Inventor: Dong O. Kwak, Anyang, Rep. of Korea

[73] Assignee: Dong Il Technology Ltd., Kyunggi-do, Rep. of Korea

[21] Appl. No.: 284,813

[22] Filed: Aug. 2, 1994

[30] Foreign Application Priority Data

Oct. 30, 1993 [KR] Rep. of Korea ............... 93-22533

[51] Int. Cl.$^6$ .................................................... H03H 7/09
[52] U.S. Cl. ............................................. 333/185; 439/620
[58] Field of Search .......................... 333/12, 177, 181, 333/185; 439/620

[56] References Cited

U.S. PATENT DOCUMENTS

| | | | |
|---|---|---|---|
| 4,408,171 | 10/1983 | Akino et al. | 333/181 X |
| 4,761,623 | 8/1988 | Schneider | 333/181 X |
| 5,340,944 | 8/1994 | Wang | 333/185 X |

FOREIGN PATENT DOCUMENTS 2-12748   4/1990   Japan.

*Primary Examiner*—Benny T. Lee
*Assistant Examiner*—Justin P. Bettendorf
*Attorney, Agent, or Firm*—Darby & Darby

[57] ABSTRACT

A compact AC filter having a plug connection assembly including a support wall from which extends in a forward direction a ground terminal and a pair of power terminals and in a rearward direction a ground tab connected to the ground terminal. A filter assembly housing having a recess and a cavity is attached to the plug connector assembly and contains filter components including at least one capacitor, an inductor in said recess and an earth (ground) inducter in said cavity. A shield member bridges the connector assembly and filter assembly housing and the ground tab extends into the filter housing. The ends of the earth inducter coil are respectively connected to the shield member and the ground tab.

8 Claims, 3 Drawing Sheets

COMPACT AC NOISE FILTER WITH GROUND INDUCTOR

BACKGROUND OF THE INVENTION

1. Field of the Invention

The present invention relates to a noise filter for cancelling noises of an ac power supply, more particularly, to a noise filter in which a housing for an additional earth inductor is defined within a filter body, thereby enabling the earth inductor to be established in the filter body and ensuring easy connection of the earth inductor to associated lead wires.

2. Description of the Prior Art

As is well-known, a typical ac line filter is used for cancelling noise produced in the ac power supply. FIG. 4 shows such an ac line filter of which windings or inductor coils are provided on a closed circular magnetic path.

In FIG. 4, and FIG. 5 depicting the equivalent circuit of FIG. 4, the ac line filter has a pair of windings 4,4' which are connected to terminals 1,1' and 2,2'. A core 3 forming the circular closed magnetic path has effective permeability higher than a certain value over a wide frequency range, from a low frequency region to a desired high freqeuncy region. The windings 4,4' are wound in a direction opposite to each other at opposing locations on the closed magnetic path so that a common mode current of a high frequency which flows into the terminals 1,1' or 2,2' may cause a magnetic flux in the same direction.

Capacitors 5,5' bypass a normal mode current of a high frequency in opposite phase which flows into the filter through the terminals 1,1' or 2,2'. Capacitors Cg bypass the high frequency common mode current flowing into the terminals 1,1' or 2,2' to the ground through a ground terminal 7. An electrically conductive member 6 is connected to, for example, a metal chassis or other associated metal components mounted close to the line filter.

Conventionally, such a noise filter is assembled in a metallic filter housing having a plug assembly on which terminals, for example, such as terminals 1,1' or 2,2' are securely mounted. In facing with a rear surface of the plug assembly of the filter housing, a filter body is defined to receive filter elements, for example, the windings(i.e., inductor coils) 4,4 wound on the core 3, the capacitors 5,5 serving as X-type capacitors and the capacitors Cg serving as Y-type Capacitors. A metallic bottom plate is joined to the bottom surface of the filter body.

An inner cover is disposed on the upper Slide of the filter body and the metallic fillter housing having an opened bottom surface covers the entire plug assembly and the inner cover.

Also, an additional earth inductor is connected to the periphery of the bottom plate of the noise filter.

With such a noise filter housing constructed as mentioned above, however, it is difficult to provide a space for mounting the additional earth inductor within the filter body. For this reason, the additional earth inductor must be established on the periphery of the bottom plate. Also, when the additional earth inductor is connected to associated lead wires, it generally needs a complicated connection structure between the additional earth inductor and the associated lead wires. Moreover, since the additional earth inductor extruded extends from the bottom plate, not only it is difficult to position the additional earth inductor on the bottom plate, but also the aesthetic sense of the noise filter is injured undesirably.

OBJECT OF THE INVENTION

Accordingly, an object of the present invention is to provide a noise filter in which an additional earth inductor can be established by forming an earth inductor housing in a filter body to thereby simplify a connection structure of the earth inductor to associated lead wires.

BRIEF DESCRIPTION OF THE INVENTION

In order to achieve the aforementioned object, according to a preferred embodiment of the present invention, there is provided a noise filter comprising a plug assembly having an earth terminal and power supply terminals, the plug assembly having an earth tab of U-shaped section; a filter body for receiving filter elements including at least one X-type capacitor, Y-type capacitors and an inductor coil and having an earth inductor housing defined therein; a metallic bottom plate connected to a bottom surface of the filter body; an inner cover on the upper portion of the filter body; and, a metallic filter housing for covering the plug assembly and the inner cover and having an opened bottom surface, wherein an additional earth inductor can be disposed within the earth inductor housing of the filter body.

According to the noise filter of the present invention, the earth inductor housing is defined in the filter body so that the earth inductor, can be established in the earth inductor housing provided within the filter body.

The above and other objects, features and advantages of the present invention will be apparent from the following description made in referece to the accompanying drawings.

DETAILED DESCRIPTION OF THE PREFERRED EMBODIMENT

Thereinafter, a preferred embodiment of the present invention is described in reference to the accompanying drawings.

Figure 1:
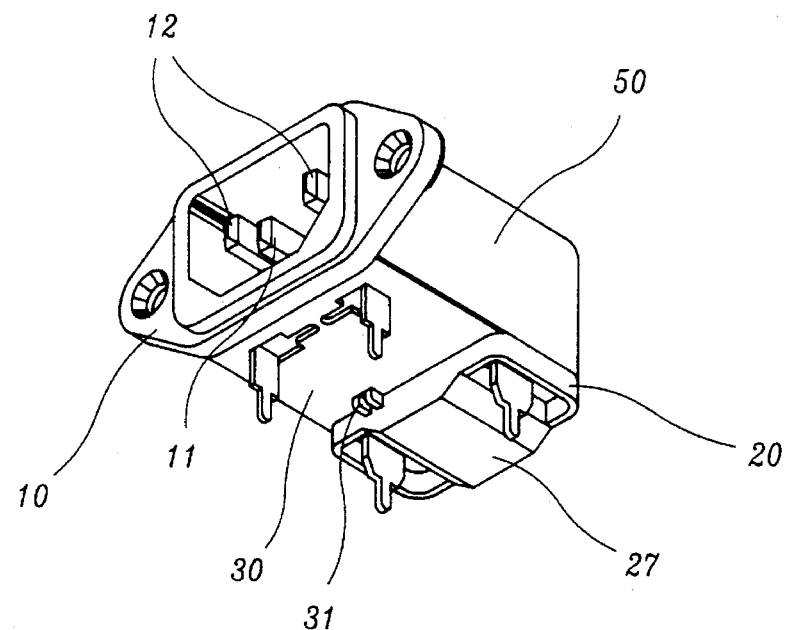
FIG. 1 is a perspective view showing an appearence of a noise filter according to a preferred embodiment of the present invention.
Figure 3:
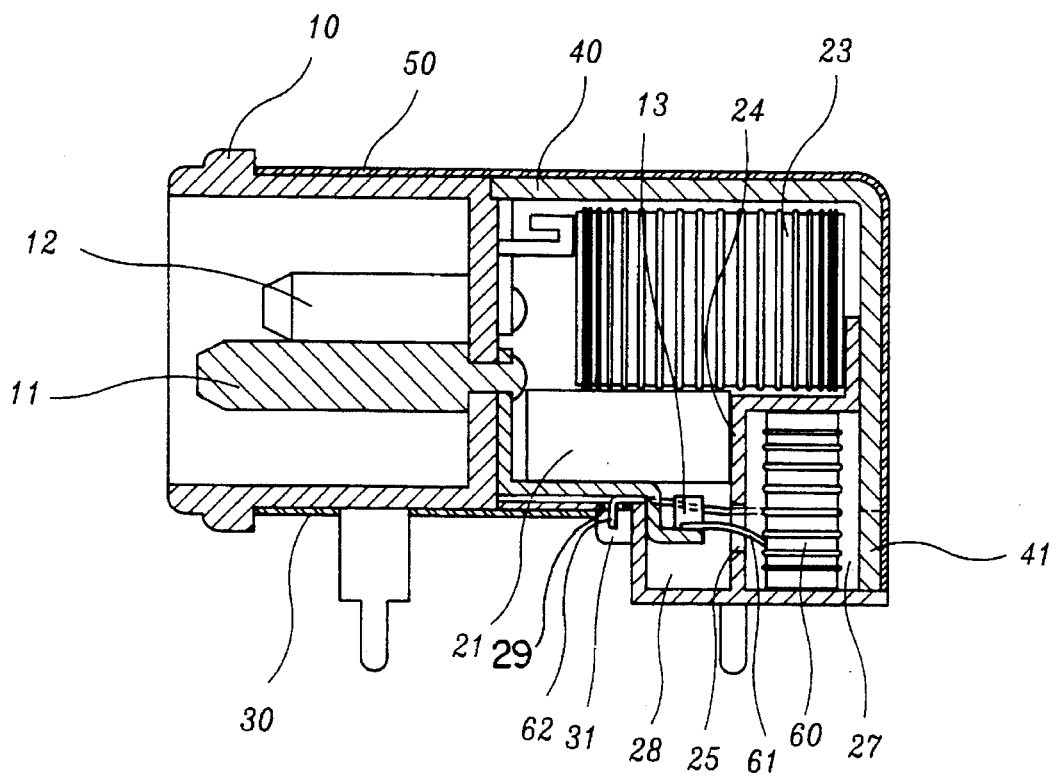
FIG. 3 is a cross-section view of the noise filter according to the present invention, which is completely assembled; and, FIG. 4 and FIG. 5 are diagrams for illustrating an example of a conventional high frequency ac line filter.
Figure 2:
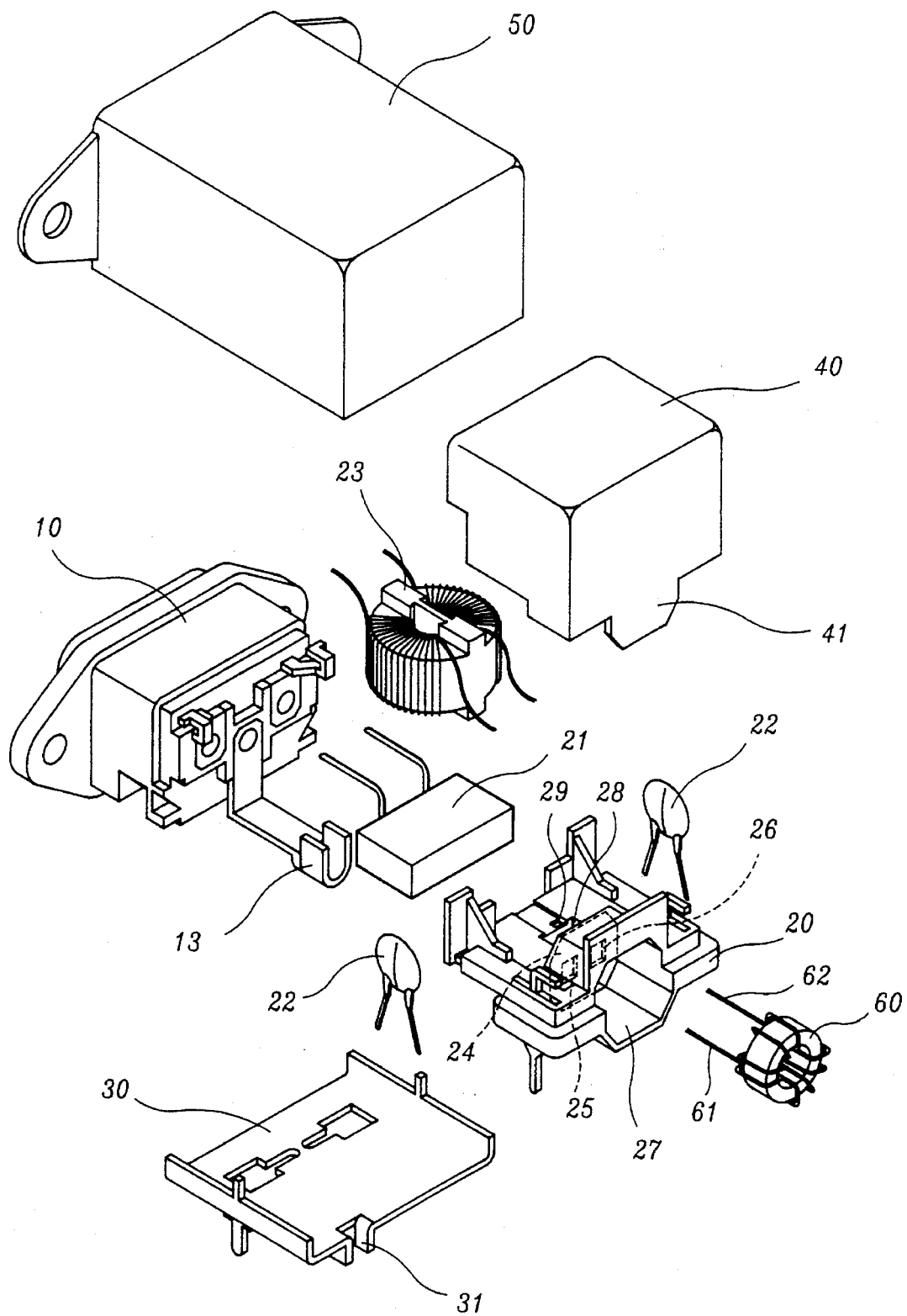
FIG. 2 is an exploded perspective view of the noise filter according to the present invention.

FIG. 1 is a perspective view showing an appearence of a noise filter according to a preferred embodiment of the present invention, FIG. 2 is an exploded perspective view of the noise filter and FIG. 3 is a cross-section view of the noise filter. According to the noise filter of the present invention, as shown in FIGS. 1 to 3, a plug assembly 10 is provided with an earth (ground potential) terminal 11 and two power supply terminals 12. A main filter body 20 is arranged behind the bottom side of the plug assembly 10 and has a X-type capacitor 21, Y-type capacitors 22 and an inductor coil 23 assembled therein. A metallic bottom plate 30 is joined with the bottom of the filter body 20, and an inner cover 40 is provided for covering the upper side of the filter body 20. A metallic filter housing 50 having an opened bottom is adopted so as to entirely cover the plug assembly 10 and the inner cover 40.

The earth terminal 11 and two power supply terminals 12 extend fowardly from the front side of the plug assembly 10 for connection to a commercial ac power supply. A tab 13 having U-shaped secton electrically connected to earth terms fastened to the rear side of the plug assembly 10.

The filter body 20 is defined at the rear side of the plug assembly 10. In the filter body 20, the X-type capacitor 21, the Y-type capacitors 22 and the inductor coil 23 are arranged in place.

Moreover, the filter body 20 is provided with an earth inductor housing 27 having an opened rear side.

A pair of lead wire connecting holes 25, 26 are formed on a front wall of the earth inductor housing 27. At the front side of the front wall 24 of the earth inductor housing 27, a lead wire connecting space 28 is defined by projecting the filter body downwardly(see FIG. 3). A penetration hole 29 is formed on the filter body 20 in the vicinity of the front side of the leadwire connecting space 28.

A metallic bottom plate 30, which is matched at the bottom of the filter body 20, has an earth inductor connecting portion 31 which can be formed by cutting a part of an edge of the bottom plate 30 and bending the cut portion of the bottom plate 30 downwardly.

Between the cut and bent portions of the earth inductor connection portion 31, one lead wire of the earth inductor 60 which will be described later is connected by placing the lead wire of the earth inductor 60 between the cut and bent connecting 31 portions of the earth inductor lead wire 62 and bending the cut and bent portions to grasp and secure the lead wire of the earth inductor 60.

At the end of the rear surface of the inner cover 40 formed over the upper side of the filter body 20, a downwardly expanded projection 41 is defined such that when the inner cover 40 is provided for covering the upper side of the filter body 20, the opened rear side of the earth inductor housing 27 of the filter body 20 is blocked to hide the earth inductor 60.

The metallic outer housing 50 having the opened lower side serves to entirely cover the plug assembly 10 and the inner cover 40.

In the drawings, reference numerals 61 and 62 denote the above-mentioned lead wire of the earth inductor 60, respectively.

Now, the procedure of assembling the noise filter according to the present invention will be described in more detail.

Figure 4:
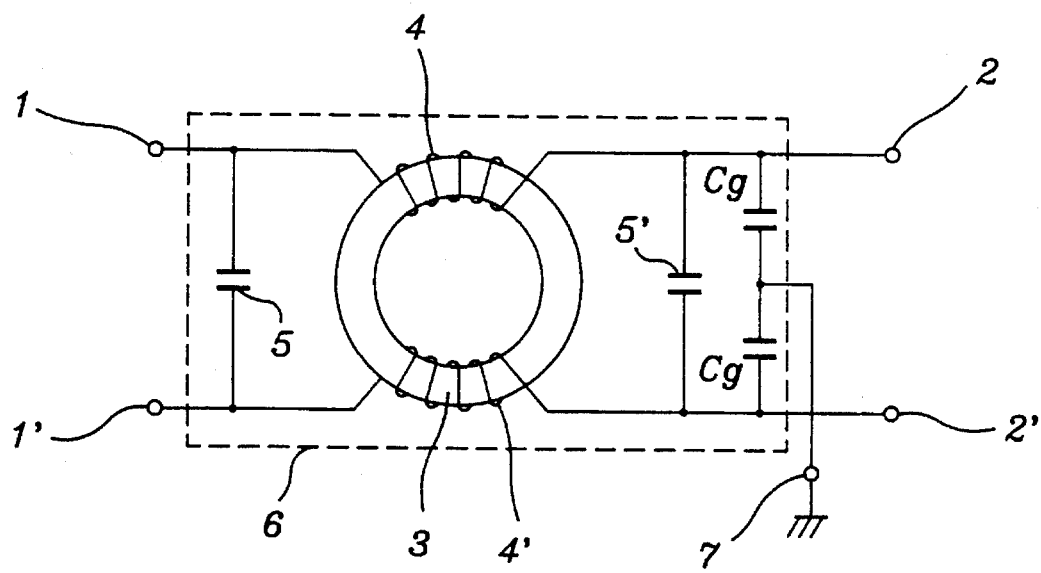
Figure 5:
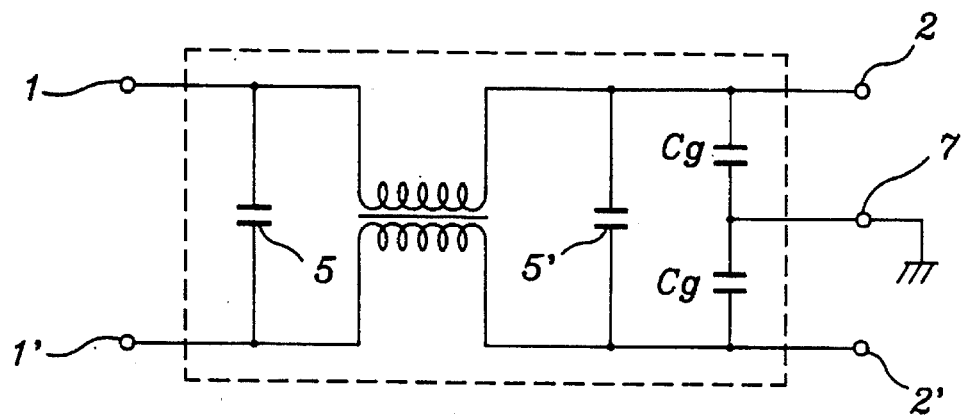

The electrical circuit of the noise filter comprising the plug assembly 10 and the filter elements including the capacitors 21 and 22 and the coil inductor 23 is very similar to that of the prior art ac line filter shown in FIGS. 4 and 5. But, the assembly structure of the noise filter is completed as described below.

The earth inductor 60 is contained in the earth inductor housing 27 defined at the rear side of the filter body 20. The U-shaped earth tab 13, provided at the rear side of the plug assembly 10, and the lead wires 61, 62 of the earth inductor 60 are connected with each other within the lead wire connecting space 28 formed at the front side of the earth inductor housing 27. More particularly, the lead wire 61 of the earth inductor 60 can be secured by placing it onto the U-shaped earth tab 13 through the lead wire connecting hole 25 of the front wall 24 and bending the U-shaped earth tab 13, while the other lead wire 62 can be secured by placing it between the earth inductor connecting portion 31 of the bottom plate 30 through the lead wire connecting hole 26 and penetration hole 29 and bending the earth inductor connecting portion 31 toward the lead wire 62. Therefore, according to the noise filter of the presentinvention, all of the connections among the components can be assured within the filter body 20 excluding the connection of the earth inductor connecting portion 31 and the bottom plate 30.

As described above, according to the noise filter of the present invention, since the connection of the filter components, excluding the connection of the earth inductor connecting portion of the bottom plate, can be easily performed within the filter body, short-circuiting of the lead wires can be completely avoided. Furthermore, because the earth inductor is contained in the earth inductor housing provided in the filter body, the connection structure of the lead wires can be markedly simplified and the appearence of the filter is extremely smart.

Meanwhile, the present invention is not limited to the example described above and, therefore, many changes and modifications may be made in the invention without departing from the spirit and scope of the invention.

What is claimed is:

1. A compact AC noise filter comprising:

a plug connector assembly of electrically insulating material including a support wall from which forwardly extends an electrically conductive ground terminal and two electrically conductive power supply terminals and an electrically conductive ground tab connected to the ground terminal, extending rearwardly from said support wall;

a filter assembly housing of electrically insulating material attached to said plug connector assembly, said filter assembly housing having a recess, and a cavity which is physically and electrically isolated from said recess;

an electrically conductive shielding member located on said plug connector assembly and said filter assembly housing;

means within said filter assembly housing to electronically filter noise of an inputted AC signal, including at least one capacitor, and first and second inductors;

said first inductor mounted in said filter assembly housing within said recess, and said second inductor mounted in said cavity and including a coil having ends respectively electrically connected to said ground tab and said shielding member.

2. A compact AC noise filter assembly according to claim 1, wherein said second inductor is an earth inductor.

3. A compact AC noise filter assembly according to claim 1, wherein said ground tab has a U-shaped section.

4. A compact AC noise filter assembly according to claim 1, wherein an expanded projection is downwardly formed at the end of a rear surface of said shielding member to which one of the ends of the second inductor coil is connected.

5. A compact AC noise filter assembly according to claim 1, wherein said filter assembly housing has a space into which said ground tab extends.

6. A compact AC noise filter assembly according to claim 1, wherein said cavity of said filtering assembly housing has a front wall and is open at a rear side thereof and extends vertically of said filter assembly housing, and at least one hole formed in said front wall through which a lead wire of said second inductor extends.

7. A compact AC noise filter assembly according to claim 6, wherein said recess of said filter assembly housing in which said first inductor is mounted is located above said cavity in which said second inductor is mounted.

8. A compact AC noise filter assembly according to claim 7, wherein said ground tab is bent downwardly along said plug assembly support wall and extends into said filter assembly housing adjacent to said front wall of said cavity.

* * * * *